United States Patent
Powar et al.

(10) Patent No.: US 11,877,407 B2
(45) Date of Patent: Jan. 16, 2024

(54) SURGE PROTECTION DEVICE

(71) Applicant: Eaton Intelligent Power Limited, Dublin (IE)

(72) Inventors: Ramesh Shivaji Powar, Kolhapur (IN); Ramesh Jagadale, Pune (IN); Jeffrey Cox, Venetia, PA (US); Jeffrey W. Lockhart, Pittsburgh, PA (US); Victor Epee, Pittsburgh, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 744 days.

(21) Appl. No.: 16/995,402

(22) Filed: Aug. 17, 2020

(65) Prior Publication Data

US 2022/0053649 A1     Feb. 17, 2022

(51) Int. Cl.
| | | |
|---|---|---|
| H05K 5/00 | (2006.01) | |
| H05K 5/02 | (2006.01) | |
| H05K 1/18 | (2006.01) | |
| H01C 1/02 | (2006.01) | |
| H01C 7/12 | (2006.01) | |

(52) U.S. Cl.
CPC ............ *H05K 5/006* (2013.01); *H01C 1/02* (2013.01); *H01C 7/12* (2013.01); *H05K 1/18* (2013.01); *H05K 5/0052* (2013.01); *H05K 5/0247* (2013.01); *H05K 5/0069* (2013.01); *H05K 2201/09163* (2013.01); *H05K 2201/10106* (2013.01); *H05K 2201/10196* (2013.01)

(58) Field of Classification Search
CPC ........ H05K 5/006; H05K 1/18; H05K 5/0247; H05K 5/0069; H05K 2201/09163; H05K 2201/10106; H05K 2201/10196; H01C 1/02; H01C 7/12

See application file for complete search history.

(56) References Cited

U.S. PATENT DOCUMENTS

| | | | |
|---|---|---|---|
| 2014/0253283 A1* | 9/2014 | Depping | H01C 7/126 338/20 |
| 2015/0155113 A1* | 6/2015 | Newase | H01H 71/125 200/293 |
| 2017/0032902 A1 | 2/2017 | Maloney et al. | |
| 2019/0006824 A1* | 1/2019 | Sasaki | H02B 1/40 |

FOREIGN PATENT DOCUMENTS

WO   WO-2018090078 A1 *  5/2018

OTHER PUBLICATIONS

CN 107818890 English Translation: published in 2018 (Year: 2018).*

* cited by examiner

*Primary Examiner* — Pete T Lee
(74) *Attorney, Agent, or Firm* — Eckert Seamans Cherin & Mellott, LLC

(57) ABSTRACT

A surge protection device has a housing that is formed from a first lateral portion, a middle portion, and a second lateral portion that are connected together with a plurality of fasteners. The surge protection device includes an electronic apparatus having a neutral wire and further includes a housing that advantageously includes a strain relief that causes the neutral wire to frictionally engage the housing with sufficient friction to resist a predetermined tension applied to the free end or other portion of the neutral wire at the exterior of the housing from damaging an electrical connection between the neutral wire and a circuit board within an interior region of the surge protection device.

19 Claims, 15 Drawing Sheets

SURGE PROTECTION DEVICE

BACKGROUND

Field

The disclosed and claimed concept relates to a surge protection device and, more specifically, to a surge protection device having housing made from three components and including a strain relief that protects a neutral wire.

Related Art

Surge protection devices are used to protect electrical circuitry from damage due to an over-current condition, such as an overload condition or a relatively high level short circuit or fault condition, damage due to a short duration (microsecond range) overvoltage condition, such as electrical surges, spikes, transients, and other conditions. Such surge protection devices can be said to include those which include a varistor, which is an electronic component whose impedance varies as a function of the voltage across its leads, which is operable to protect the electrical circuitry. Certain surge protection devices are mountable in a load center and are electrically connected with one or more line conductors of the load center, and possibly are additionally electrically connected with a neutral connection of the load center.

While such surge protection devices have been generally effective for their intended purposes, they have not been without limitation. For instance, surge protection devices having a neutral wire are sometimes prone to damage if the neutral wire is subjected to a tension load, such as if the neutral wire is pulled, which can sometimes result in the neutral wire becoming partially or fully detached from electronic components internal to the surge protection device or can otherwise damage the surge protection device. Furthermore, surge protection devices can be complex to manufacture and can have a housing formed of four or more components, which increases cost and complexity and can result in faulty manufacture. As such, improvements would be desirable.

SUMMARY OF THE INVENTION

These needs, and others, are met by at least one embodiment of this invention which provides an improved surge protection device having a housing that is formed from a first lateral portion, a middle portion, and a second lateral portion that are connected together with a plurality of fasteners. The surge protection device includes an electronic apparatus having a neutral wire and further includes a housing that advantageously includes a strain relief that causes the neutral wire to frictionally engage the housing with sufficient friction to resist a predetermined tension applied to the free end or other portion of the neutral wire at the exterior of the housing.

Accordingly, an aspect of the disclosed and claimed concept is to provide an improved surge protection device that includes a housing that is formed from a first lateral portion, a middle portion, and a second lateral portion that are connected together with a number of fasteners. As employed herein, the expression "a number of" and variations thereof shall refer broadly to any non-zero quantity, including a quantity of one.

Another aspect of the disclosed and claimed concept is to provide such an improved surge protection device wherein the first lateral portion is directly connected with the middle portion, and wherein the second lateral portion is likewise directly connected with the middle portion.

Another aspect of the disclosed and claimed concept is to provide such an improved surge protection device wherein a portion of the first lateral portion and a portion of the second lateral portion are directly connected together.

Another aspect of the disclosed and claimed concept is to provide such an improved surge protection device wherein the housing includes a number of alignment bosses and a number of alignment receptacles that are cooperable with one another to aid in alignment of the components of the housing and that facilitate assembly of the surge protection device.

Another aspect of the disclosed and claimed concept is to provide such an improved surge protection device that includes a neutral conductor, and wherein the housing includes a strain relief that provides a routing path for the neutral conductor and a number of wall portions that are situated adjacent the routing path, with the neutral wire being structured to frictionally engage the number of wall portions with sufficient friction to resist a predetermined tension applied to a portion of the neutral wire situated at an exterior of the housing.

Accordingly, an aspect of the disclosed and claimed concept is to provide an improved surge protection device, the general nature which can be generally stated as including a housing comprising a first lateral portion, a second lateral portion, and a middle portion, at least a part of the middle portion being situated between the first and second lateral portions, the housing having an interior region, an electronic apparatus situated on the housing, the electronic apparatus comprising a circuit board, at least a first varistor electrically connected with the circuit board, and at least a first line terminal electrically connected with the circuit board, the circuit board and the at least first varistor being situated within the interior region, and at least one of the circuit board and the middle portion having a receptacle formed therein, at least a portion of the other of the at least one of the circuit board and the middle portion being received in the receptacle to thereby mount the circuit board to the middle portion.

Another aspect of the disclosed and claimed concept is to provide an improved surge protection device, the general nature which can be generally stated as including a housing comprising a first lateral portion, a second lateral portion, and a middle portion, at least a part of the middle portion being situated between the first and second lateral portions, the housing having an interior region, an electronic apparatus situated on the housing, the electronic apparatus comprising a circuit board, a neutral wire, and at least a first line terminal electrically connected with the circuit board, the circuit board being situated within the interior region, the neutral wire being electrically connected with the circuit board and having a free end situated at an exterior of the housing, and the housing further comprising a strain relief that comprises a routing path through which at least a portion of the neutral wire is routed between the interior region and the exterior, the neutral wire being structured to frictionally engage the housing with sufficient friction to resist a predetermined tension applied to a portion of the neutral wire situated at the exterior

BRIEF DESCRIPTION OF THE DRAWINGS

A further understanding of the disclosed and claimed concept can be gained from the following Description when read in conjunction with the accompanying drawings in which:

Similar numerals refer to similar parts throughout the Specification.

DESCRIPTION

An improved surge protection device 4 in accordance with a first embodiment of the disclosed and claimed concept is depicted generally in FIGS. 1-13. The surge protection device 4 can be said to include a housing 6 and an electronic apparatus 8. As can be understood from FIG. 2, the electronic apparatus 8, and thus the surge protection device 4, is electrically connectable with a pair of line conductors 10A and 10B and with a neutral connection 12, such as of a load center or other such device. As will be set forth in greater detail below, the improved surge protection device 4 is advantageously configured to be relatively easy to assemble and to have a robust configuration that is resistant to certain forms of damage to which previously known surge protection devices have been subject.

Figure 1:
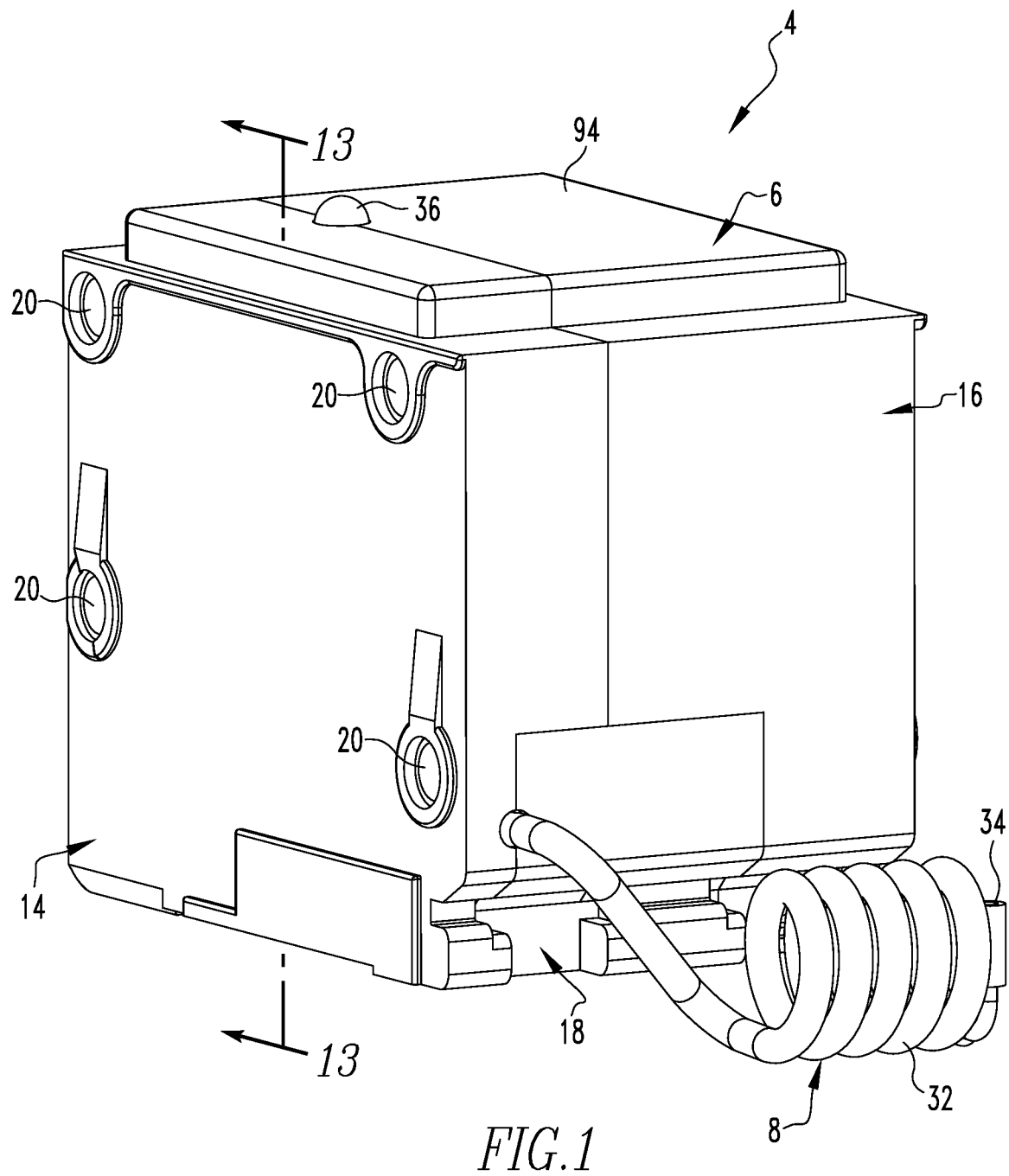
FIG. 1 is a perspective view of an improved surge protection device in accordance with a first embodiment of the disclosed and claimed concept.
Figure 2:
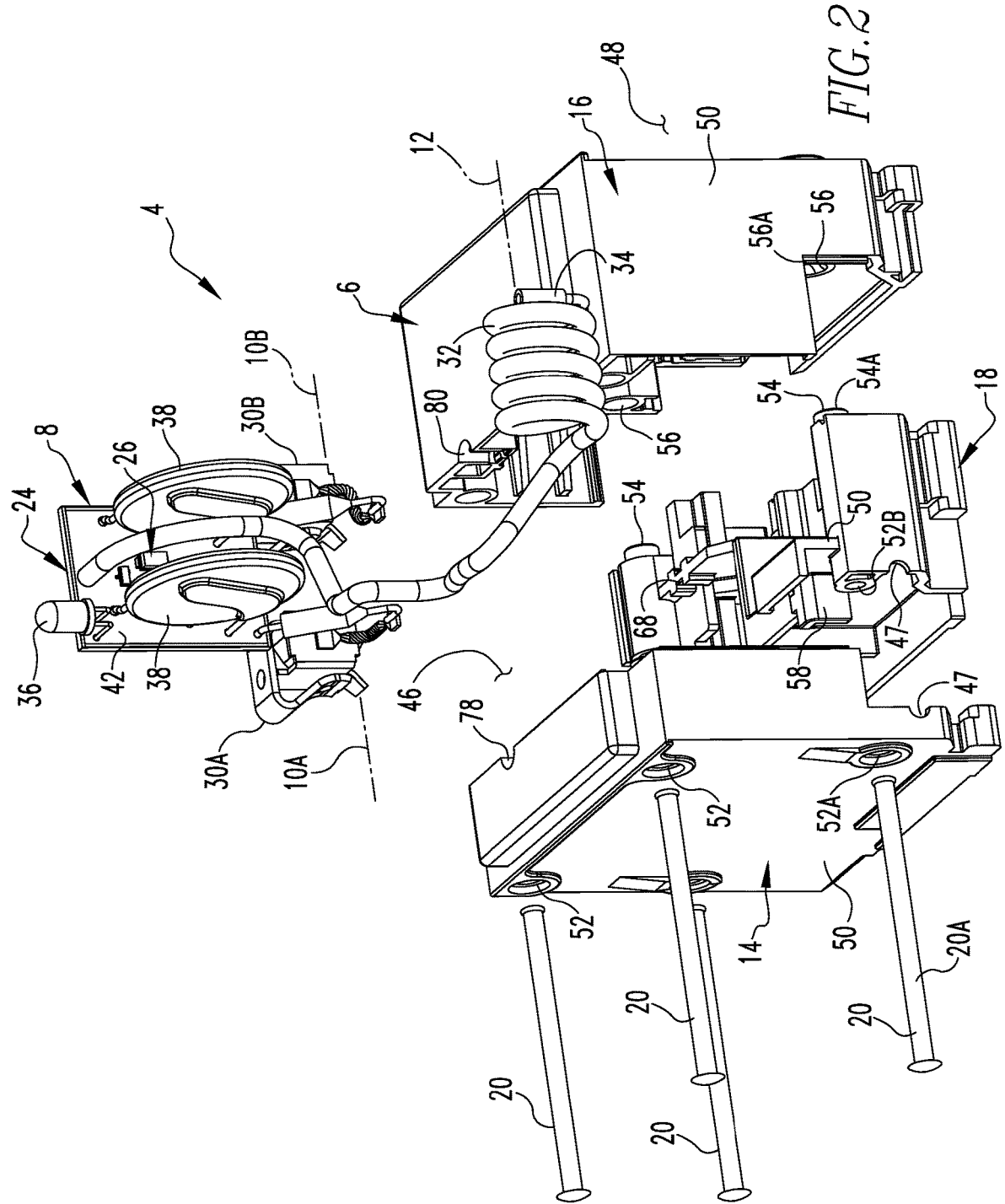
FIG. 2 is an exploded view of the first embodiment.

As can be understood from FIG. 2, the housing 6 can be said to include and to be formed from a first lateral portion 14, a second lateral portion 16, and a middle portion 18 that are connected together with a number of fasteners 20. As can be understood from FIGS. 1 and 2, the first lateral portion 14 and the middle portion 18 are directly affixed together, meaning that they are affixed to one another with substantially no intervening structures when the surge protection device 4 is assembled together with the fasteners 20. The second lateral portion 16 and the middle portion 18 are likewise directly affixed to one another when the surge protection device 4 is assembled. Furthermore, it can be seen that a portion of the first lateral portion 14 and a portion of the second lateral portion 16 are likewise directly affixed to one another when the surge protection device 4 is assembled, i.e., that portion of the first and second lateral portions 14 and 16 that does not have the middle portion 18 interposed therebetween.

Figure 3:
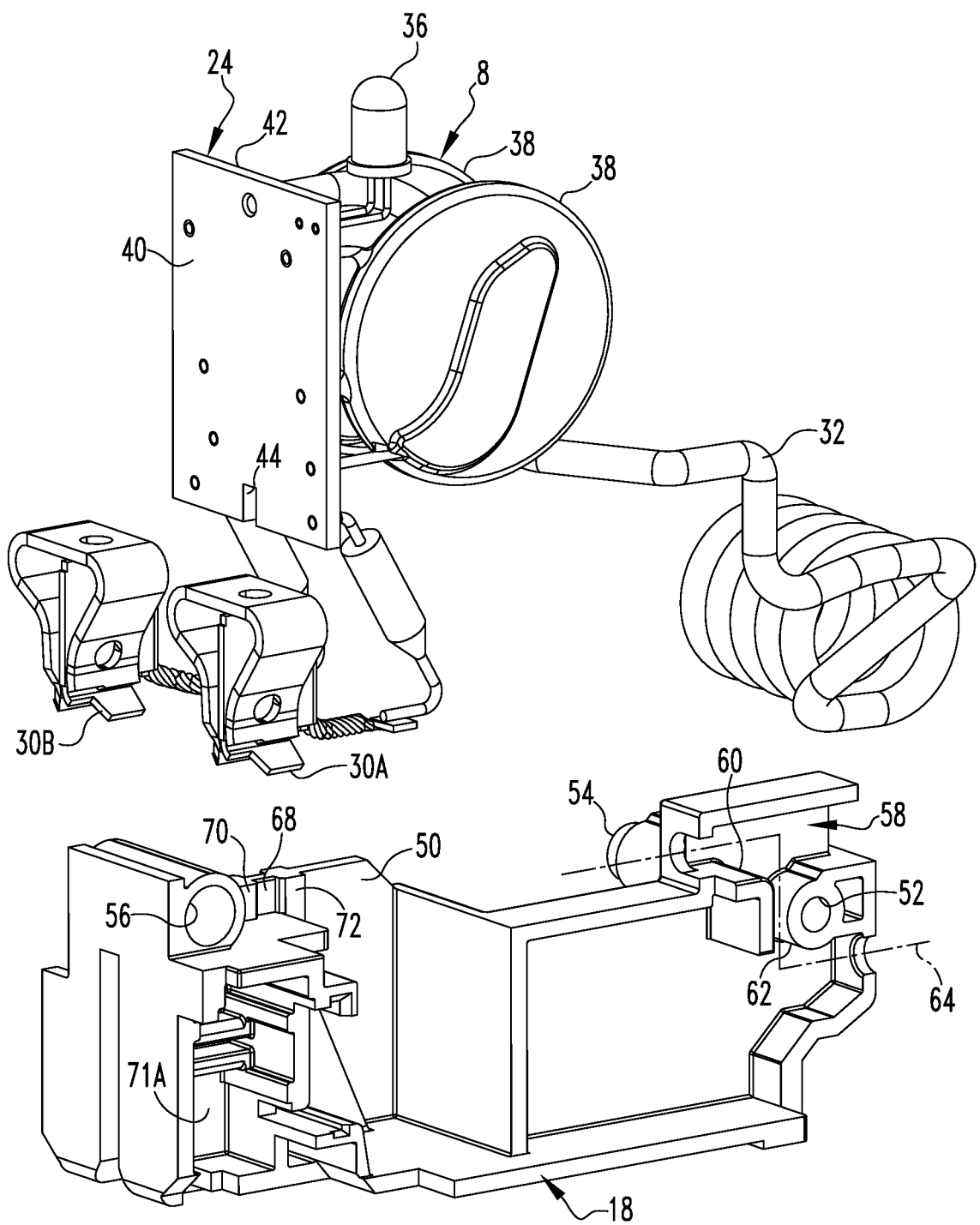
FIG. 3 is a perspective view of an electronic apparatus and a middle portion of a housing of the first embodiment exploded away from one another.

As can be understood from FIGS. 2 and 3, the electronic apparatus 8 can be said to include a circuit board 24 having a number of electronic components that are generally indicated at the numeral 26 and that are situated on the circuit court 24 or are electrically connected therewith. The electronic components 26 can include any of a wide variety of electronic components and in particular can be said to include a processor apparatus that includes a processor and a storage that are used to process signals detected by the electronic apparatus 8. The electronic apparatus 8 further includes a pair of line terminals that are indicated at the numeral 30A and 30B and a neutral wire 32 that are electrically connected with the circuit board 24. It is understood that the line terminal 30A is electrically connectable with the line conductor 10A, the line terminal 30B is electrically connectable with the line conductor 10B, and the neutral wire 32 is connectable with the neutral connection 12. The neutral wire 32 has a free end 34 opposite its connection with the circuit board 24. The signals that are detected by the electronic apparatus 8 may be received thereon in any of a variety of fashions, such as from any one or more of the line terminals 30A and 30B and the neutral wire 32, by way of example and without limitation.

The electronic apparatus 8 further includes an illumination source 36 in the exemplary form of an LED that is electrically connected with the circuit board 24. The electronic apparatus 8 additional includes a number of varistors 38 that are electrically connected with the circuit board 24 and which, in the depicted exemplary embodiment, are metal oxide varistors (MOVs).

As can be understood from FIGS. 2 and 3, the circuit board 24 can be said to include a first surface 40 and a second surface 42 opposite one another. The circuit board 24 further has a receptacle 44 that is formed in an end thereof and that extends between the first and second surfaces 40 and 42.

Figure 5:
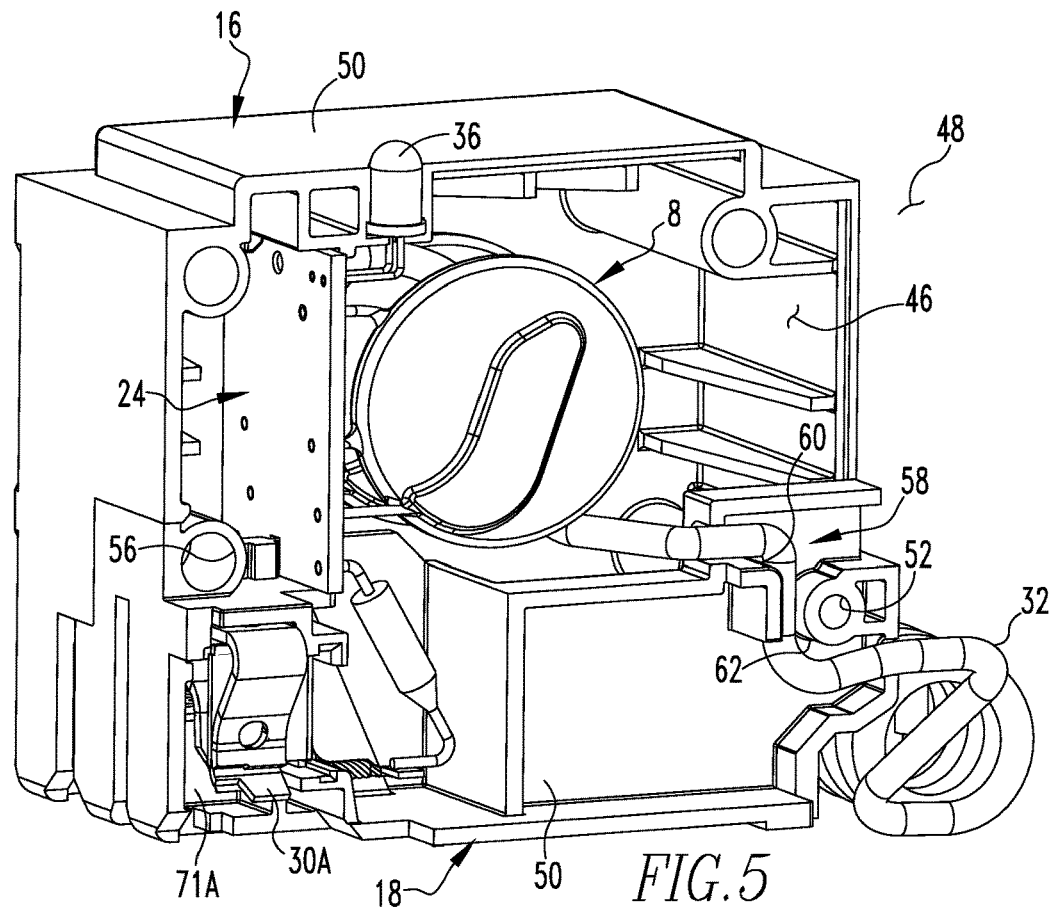
FIG. 5 is a view similar to FIG. 4, but showing an additional portion of the housing.
Figure 6:
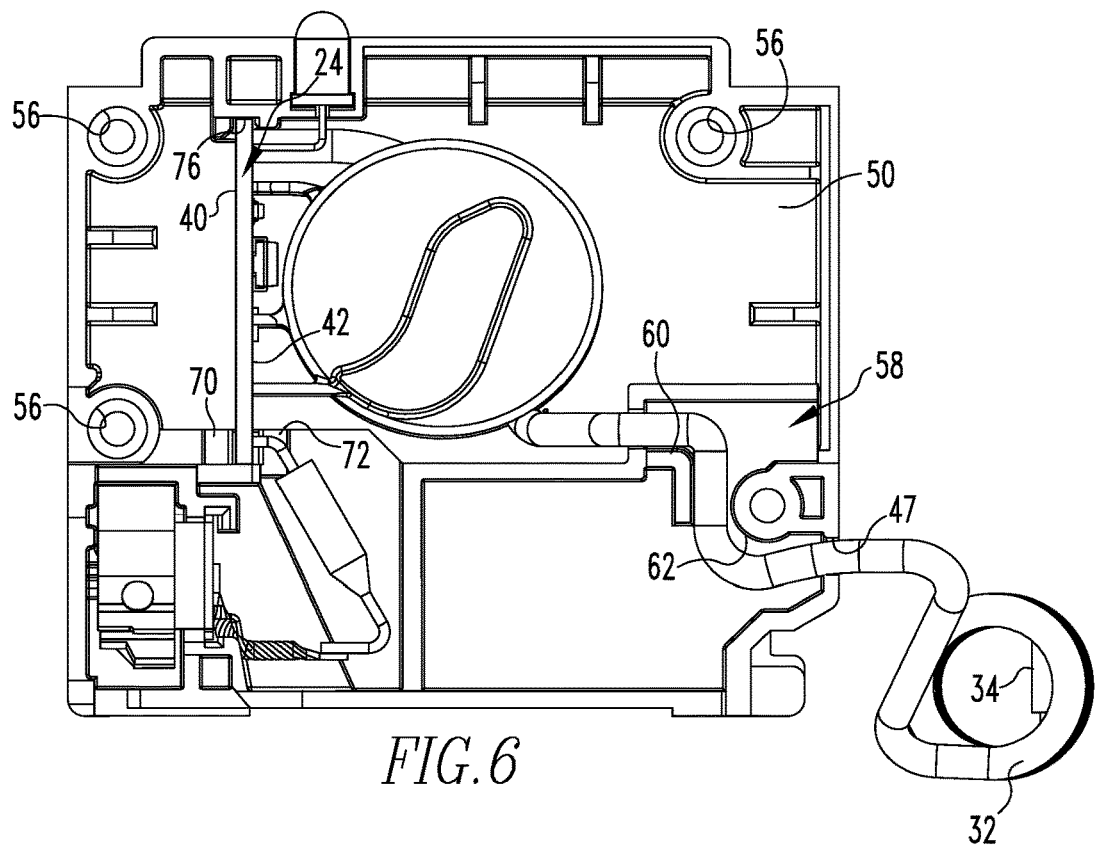
FIG. 6 is a view similar to FIG. 5, except depicting the subject matter of FIG. 5 in a front elevational view.
Figure 6A:
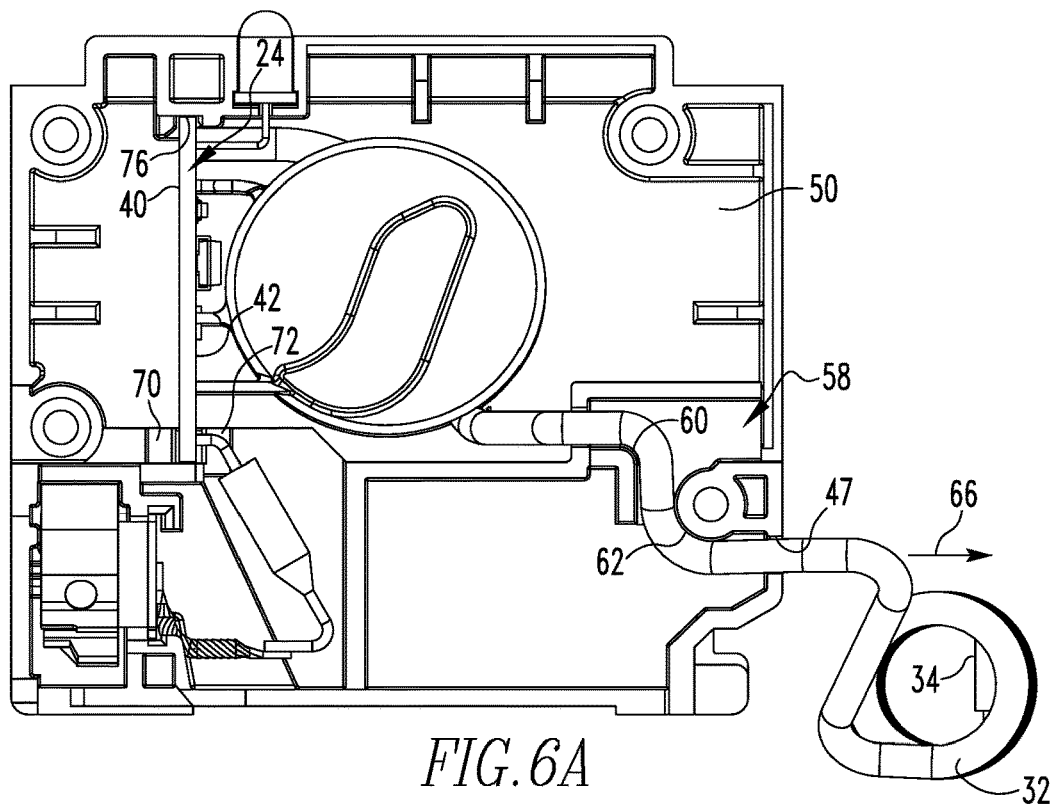
FIG. 6A is a view similar to FIG. 6, except depicting a neutral wire frictionally engaging a strain relief when subjected to a tension loading.
Figure 7:
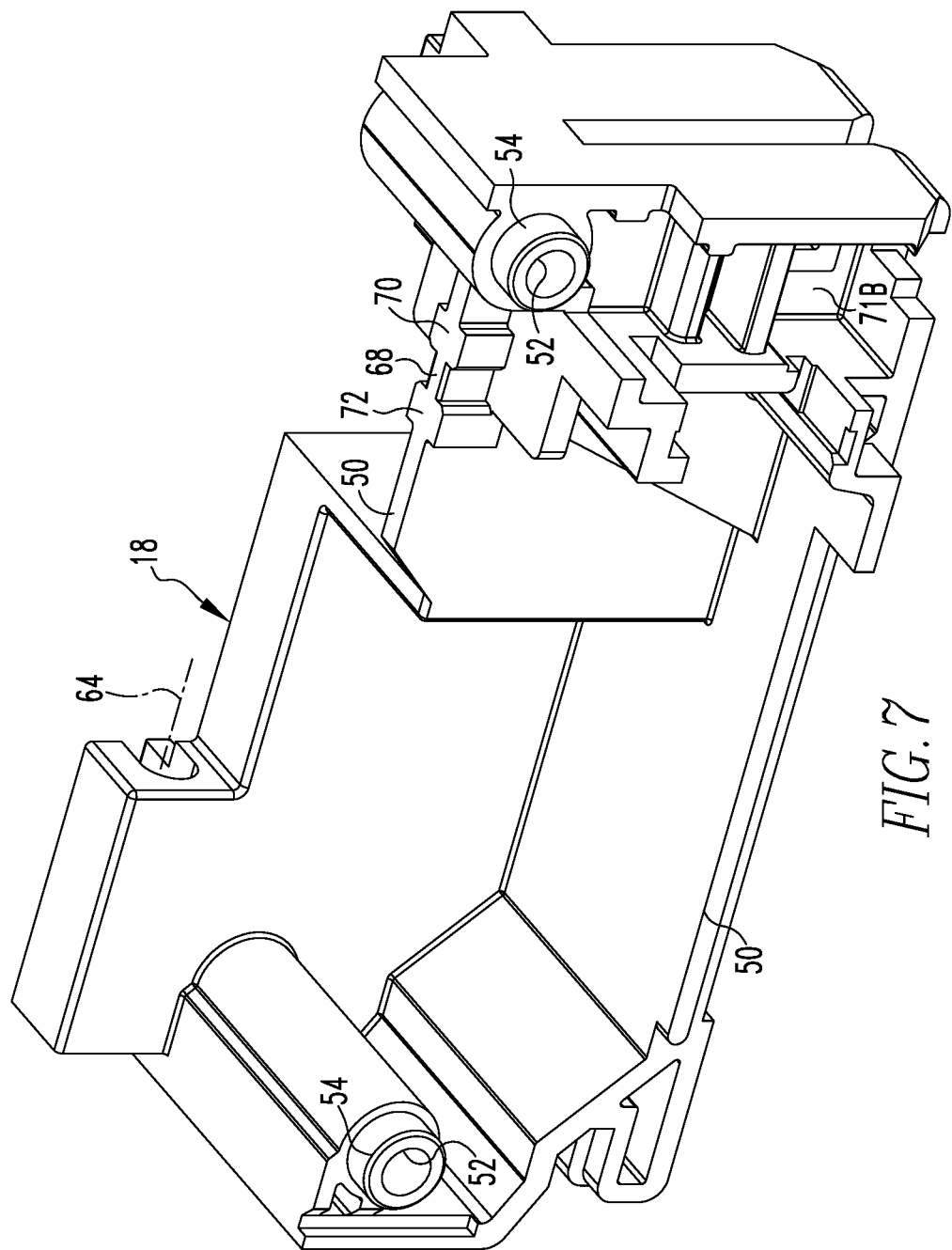
FIG. 7 is another perspective view of the middle portion.

As can be understood from FIGS. 2 and 5, by way of example, the housing 6 can be said to include an interior region 46 adjacent the first and second lateral portions 14 and 16 and the middle portion 18 when assembled together by the fasteners 20. It is understood, however, that a portion of the illumination source 36 protrudes slightly from the first and second lateral portions 14 and 16, as can be understood from FIG. 1. It is also understood that a portion of the neutral wire 32 protrudes through an opening 47 that is formed partially in the first lateral portion 14 and partially in the middle portion 18, such that a portion of the neutral wire 32 that includes the free end 34 is situated at an exterior 48 of the housing 6, the exterior 48 being opposite the interior region 46.

The first and second lateral portions 14 and 16 and the middle portion 18 can each be said to include a number of walls, all of which are generally indicated at the numeral 50, and to further have a number of holes formed therein, all of which are indicated generally at the numeral 52. The walls 50 together can be generally said to separate the interior region 46 from the exterior 48. The fasteners 20 are receivable through the holes 52 that are formed in the first and second lateral portions 14 and 16 and in the middle portion 18 and that are aligned with one another to permit the fasteners 20 to be received therein. The fasteners 20 received in the holes 52 are then upset or otherwise caused to be plastically deformed to retain the housing 6 in the assembled condition that is depicted generally in FIG. 1.

Figure 8:
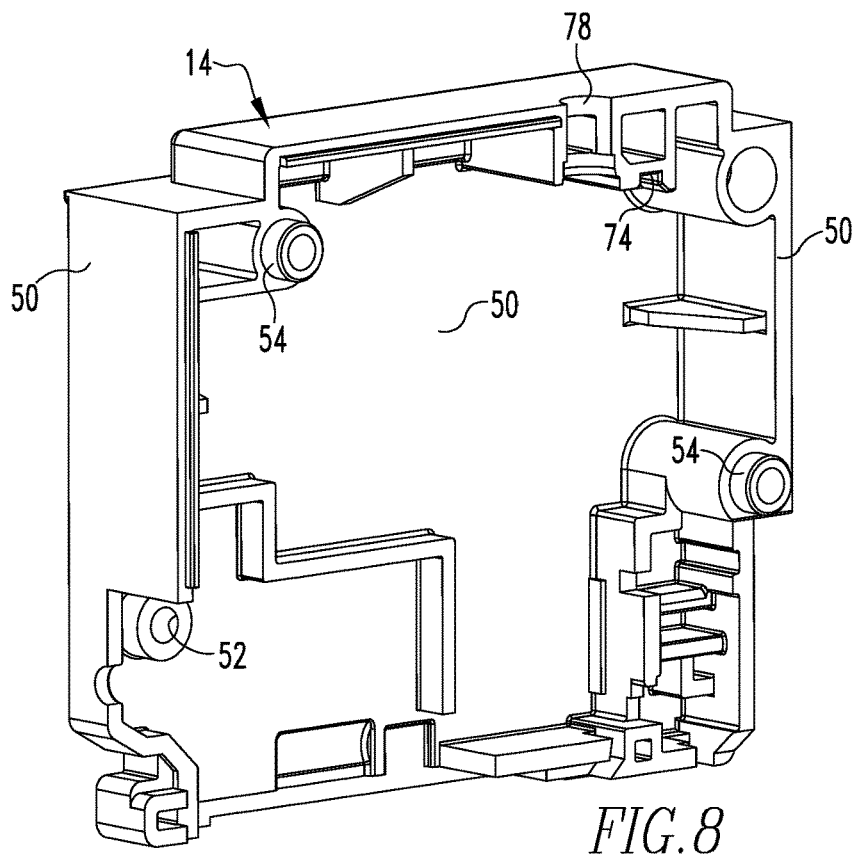
FIG. 8 is a perspective view of a first lateral portion of the housing.

The housing 6 additionally includes a number of alignment bosses 54 and a number of alignment receptacles 56 that are cooperable with one another to align the first and second lateral portions 14 and 16 and the middle portion 18 with one another. For instance, FIG. 2 depicts that the middle portion 18 includes a pair of the alignment bosses 54 that are cooperable with alignment receptacles 56 that are formed in the second lateral portion 16. FIG. 8 depicts that the first lateral portion 14 includes a pair of the alignment bosses 54, one of which is cooperable with an alignment receptacles 56 that is formed on the middle portion 18, and the other of which is cooperable with an alignment receptacles 56 that is formed on the second lateral portion 16. In this regard, it can be understood that when the housing 6 is assembled as in FIG. 1, the alignment bosses 54 are received in the corresponding alignment receptacles 56 which causes the holes 52 that are formed in the first and second lateral portions 14 and 16 and the middle portion 18 to be aligned with one another to enable the reception of the fasteners 20 therein. For instance, and as can be understood from FIG. 2, one of the fasteners, indicated at the numeral 20A is receivable in a hole 52A that is formed in the first lateral portion 14 and is further receivable in another one of the holes that is indicated at the numeral 52B and that is formed in the middle portion 18. The same fastener 20A is receivable through one of the alignment bosses that is indicated at the numeral 54A and is further receivable through an alignment receptacle that is indicated at the numeral 56A. In this regard, it is understood that the alignment boss 54A is received in and engaged with the alignment receptacles 56A when the housing 6 is assembled together to facilitate alignment between the middle portion 18 and the second lateral portion 16. It therefore can be understood that the fastener 20A is receivable through a plurality of the holes 52 and is also receivable through an aligned alignment boss 54 and a corresponding alignment receptacle 56 that are cooperated with one another.

As can be understood from FIGS. 3-6A, the housing 6 includes a strain relief 58 that is formed on the middle portion 18 and that is cooperable with the neutral wire 32 in order to resist damage to the electrical connection between the neutral wire 32 on the circuit board 24. For instance, a standard promulgated by Underwriters Laboratories and referred to as UL 1449 includes a portion referred to as "56 Strain Relief Test" which specifies that in certain circumstances a wire must be provided with sufficient strain relief that it withstands for one minute a load of 35 pounds force applied to the wire.

The strain relief 58 includes a first wall portion 60 and a second wall portion 62 and further includes a routing path 64 (FIG. 3) through which a portion of the neutral wire 32 passes when extending between the interior region 46, where it is electrically connected with the circuit board 24, and the exterior 48. The first and second wall portions 60 and 62 are each situated adjacent the routing path 64, and the first and second wall portions 60 and 62 are configured to cause the routing path 64 to be a tortuous path. In this regard, it is understood from FIGS. 6 and 6A that when the neutral wire 32 is subjected to a tensile force such as is represented by an arrow 66 representing a pulling force applied to the neutral wire 32, the neutral wire 32 will frictionally engage the first and second wall portions 60 and 62 with sufficient frictional force that it can withstand for one minute a predetermined tensile load, such as the aforementioned 35 pound force load that may be applied to the neutral wire 32 and which must be withstood for one minute in order to meet the aforementioned UL standard 1449. In this regard, it can be seen that the routing path 64 is non-straight, meaning that it includes one turn that extends past the first wall portion 60 and a second turn that extends past the second wall portion 62, with the first and second turns being in opposite directions to provide the aforementioned tortuous path to the routing path 64 through which the neutral wire 32 extends when passing through the strain relief 58. The strain relief 58 is advantageously molded into the middle portion 18 and thus does not require a separate component in order to protect the electrical connection that exists between the neutral wire 32 and the circuit board 24.

Figure 4:
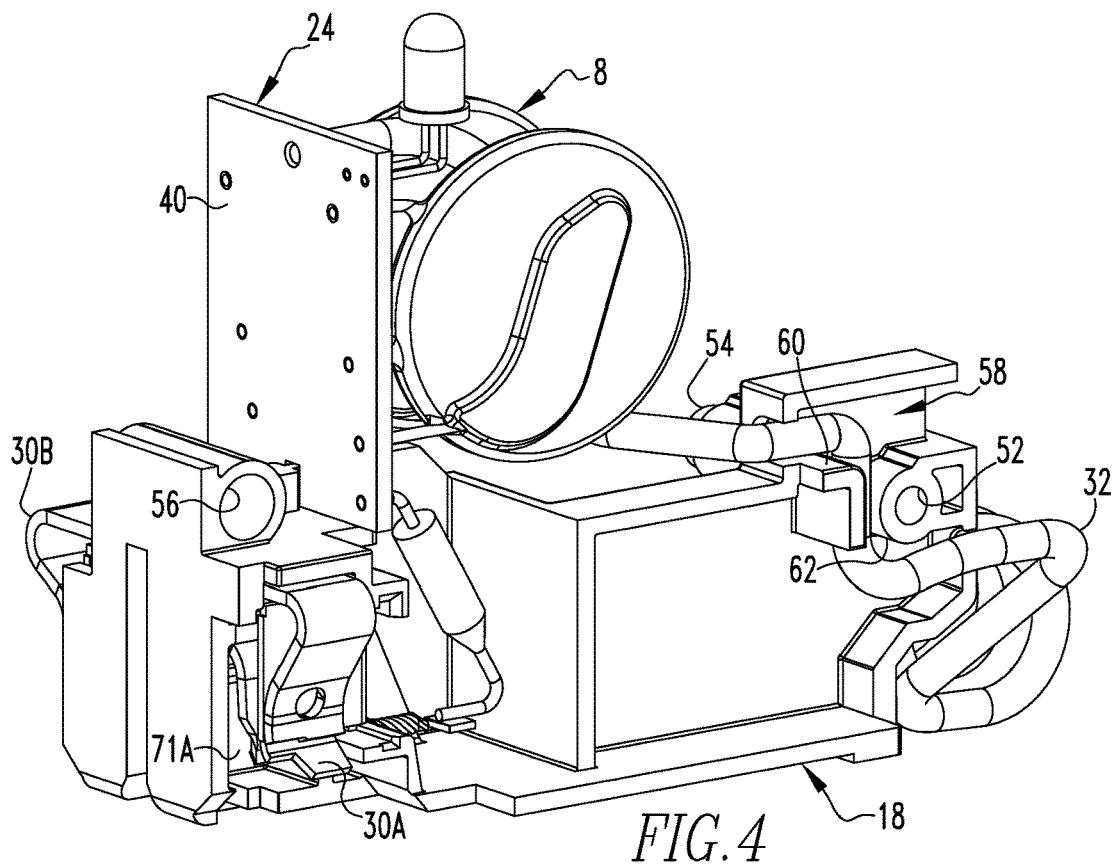
FIG. 4 is a view similar to FIG. 3, except depicting the electronic apparatus and the middle portion in a non-exploded condition.

In this regard, it can be understood from FIGS. 3-5 that the electronic apparatus 8 is mounted to the middle portion 18 with the neutral wire 32 extending through the routing path 64 of the strain relief 58 that is formed on the middle portion 18. As can be understood from FIG. 3, a wall 50 of the middle portion 18 has a tab 68 formed thereon that is receivable in the receptacle 44 that is formed in the circuit board 24. The middle portion 18 further includes a first abutment 70 and a second abutment 72 that are situated at opposite ends of the tab 68 and that are situated adjacent the first and second surfaces 40 and 42, respectively, of the circuit board 24. That is, the tab 68 can be said to extend between the first and second abutments 70 and 72. When the tab 68 is received in the receptacle 44 that is formed in the circuit board 24, the first and second abutments 70 and 72 engage the first and second surfaces 40 and 42, respectively, of the circuit board 24 in order to mount the circuit board to the middle portion 18. The line terminals 30A and 30B are receivable in a pair of sockets that are indicated at the numerals 71A and 71B, respectively, and that are formed on the middle portion 18.

Figure 9:
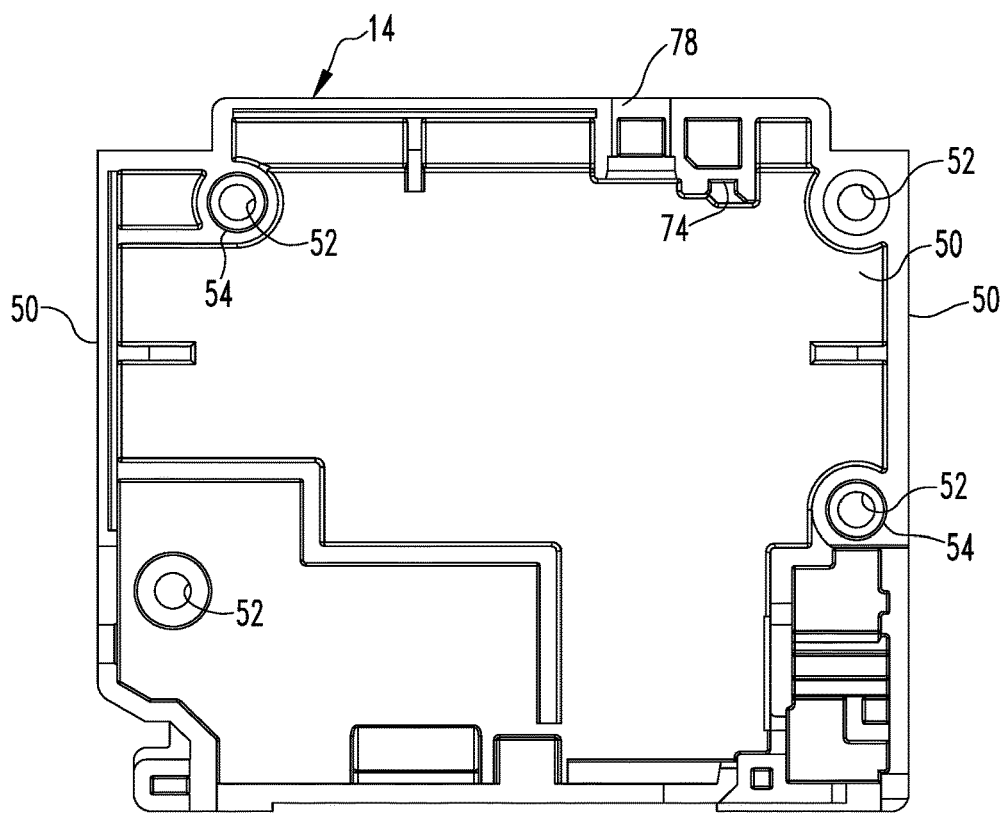
FIG. 9 is a front elevational view of the first lateral portion.
Figure 10:
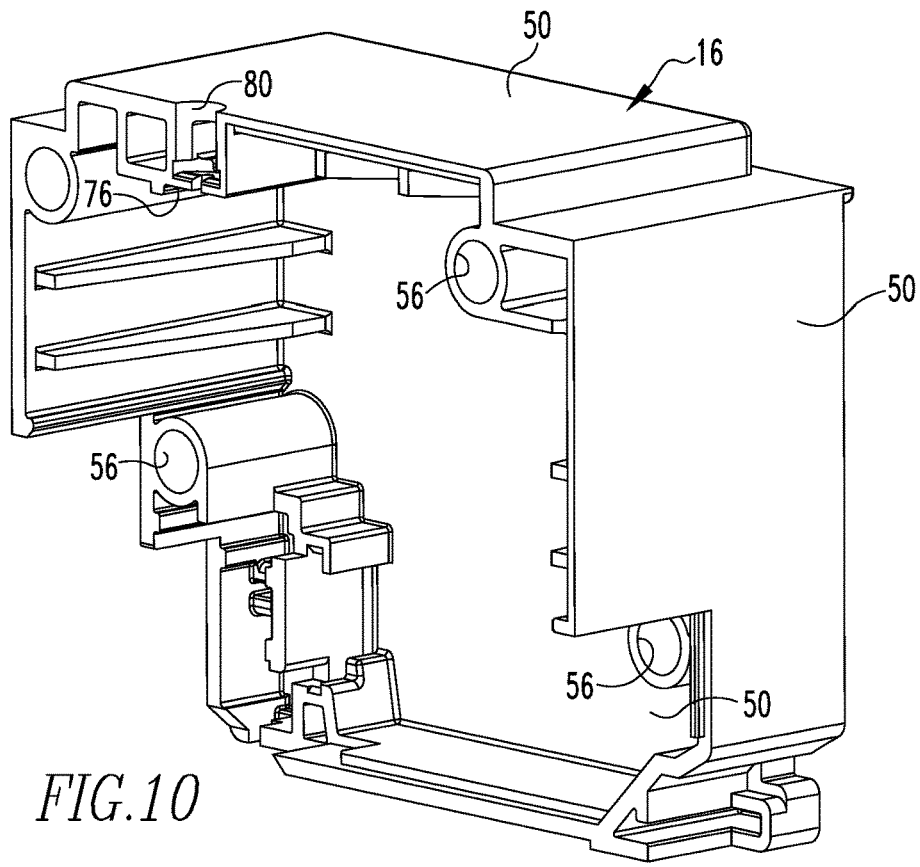
FIG. 10 is a perspective view of a second lateral portion of the housing.
Figure 11:
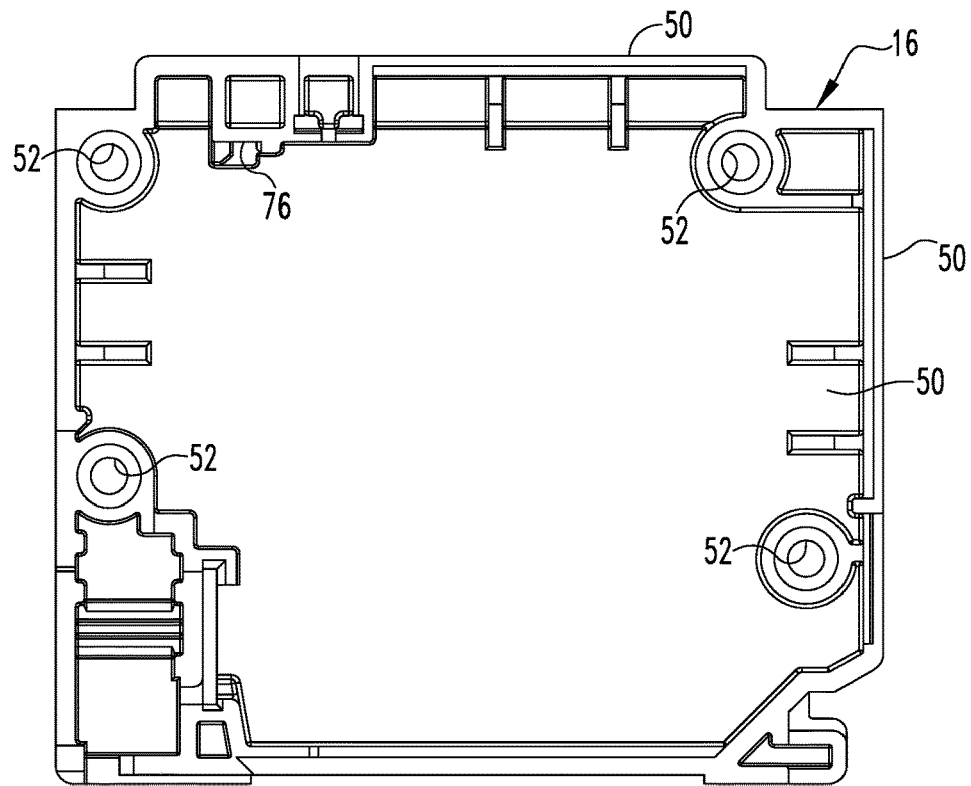
FIG. 11 is a front elevational view of the second lateral portion.
Figure 12:
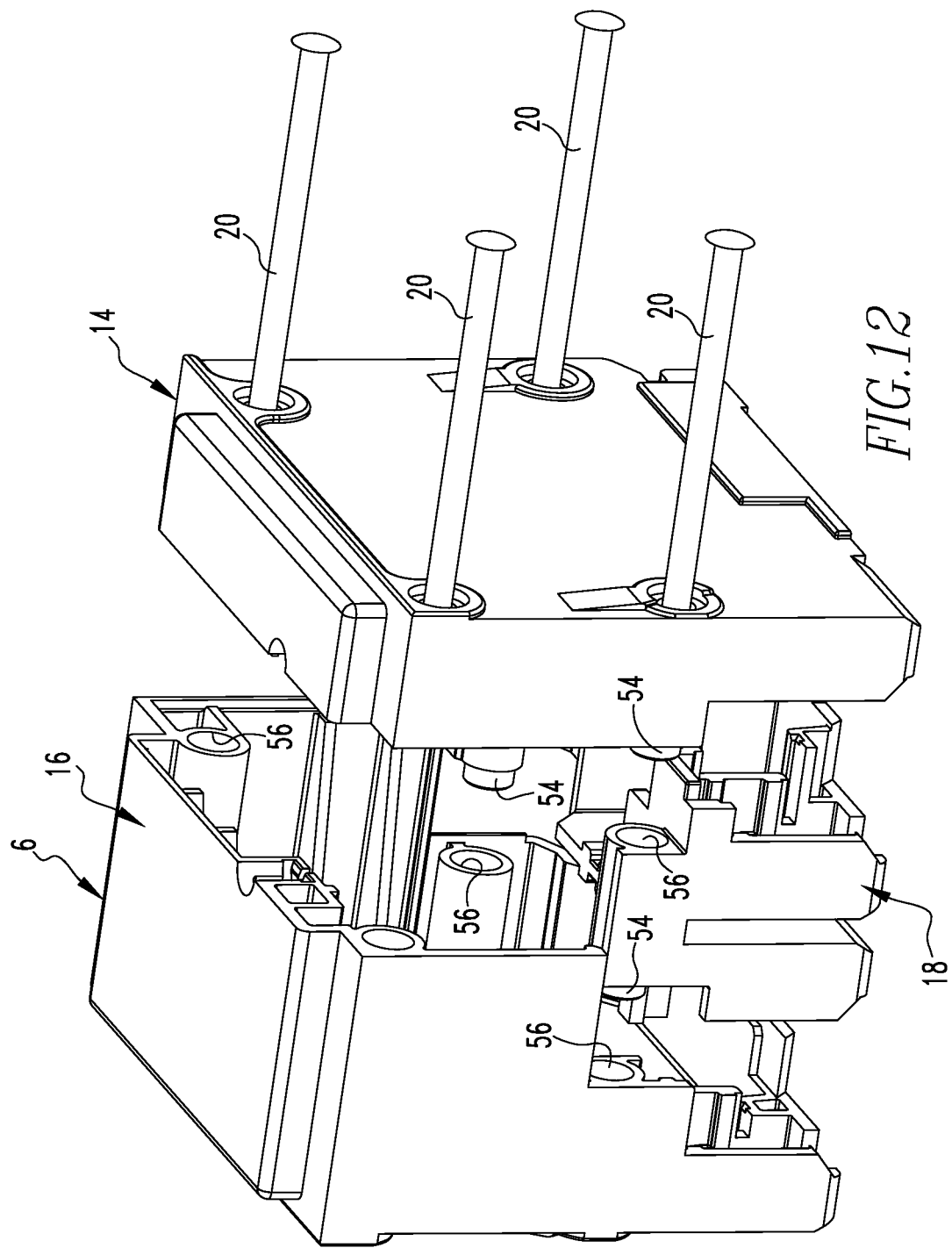
FIG. 12 is an exploded view of the housing.

As can be understood from FIGS. 8 and 9, the first lateral portion 14 has a first seat 78 formed thereon that receives an end of the circuit board 24 opposite the end thereof in which the receptacle 44 is formed. As can be understood from FIGS. 10 and 11, the second lateral portion 16 likewise has a second seat 80 formed thereon that receives another portion of the end of the circuit board 24 opposite the end thereof in which the receptacle 44 is formed. The reception of the circuit board 24 in the second seat 80 is depicted generally in FIG. 6. It thus can be understood that the circuit board 24 is initially mounted to the middle portion 16 by receiving the tab 68 in the receptacle 44, at which point the neutral wire 32 can be mounted to the strain relief 58 and to extend through the routing path 64. The middle portion 18 with the electronic apparatus 18 mounted thereon can then be received on the second lateral portion 16, such as is depicted generally in FIG. 6, wherein the pair of alignment bosses 54 that are formed on the middle portion 18 are received in a corresponding pair of the alignment receptacles 56 that are formed on the second lateral portion 16 to thereby align the middle portion 18 and the second lateral portion 16 with one another.

The first lateral portion 14 can then be received on the middle portion 18 and the second lateral portion 16 that are already aligned with one another by receiving one of the alignment bosses 54 that is formed on the first lateral portion 14 into a corresponding one of the alignment receptacles 56 that is formed on the middle portion 18 and by receiving the other of the alignment bosses 54 that is formed on the first lateral portion 14 with the corresponding alignment receptacle 56 that is formed on the second lateral portion 16. Such reception of the first lateral portion 14 on the second lateral portion 16 and the middle portion 18 causes the end of the circuit board 24 opposite the receptacle 44 to be received in the first support 74 of the first lateral portion 14. In such a fashion, the circuit board is interposed between the tab 68 and the first and second supports 74 and 76 to securely retain the circuit board 24 to the housing 6 within the interior region 46.

It can also be understood from FIGS. 8 and 9 that the first lateral portion 14 has a first seat 78 formed therein that receives a portion of the illumination source 36. Likewise, it can be understood from FIGS. 10 and 11 that the second lateral portion 16 has a second seat 80 formed therein that receives another portion of the illumination source 36. The illumination source 36 is thus situated between the first and second seats 78 and 80 when the surge protection device 4 is in an assembled state, such as is depicted generally in FIG. 1.

Figure 13:
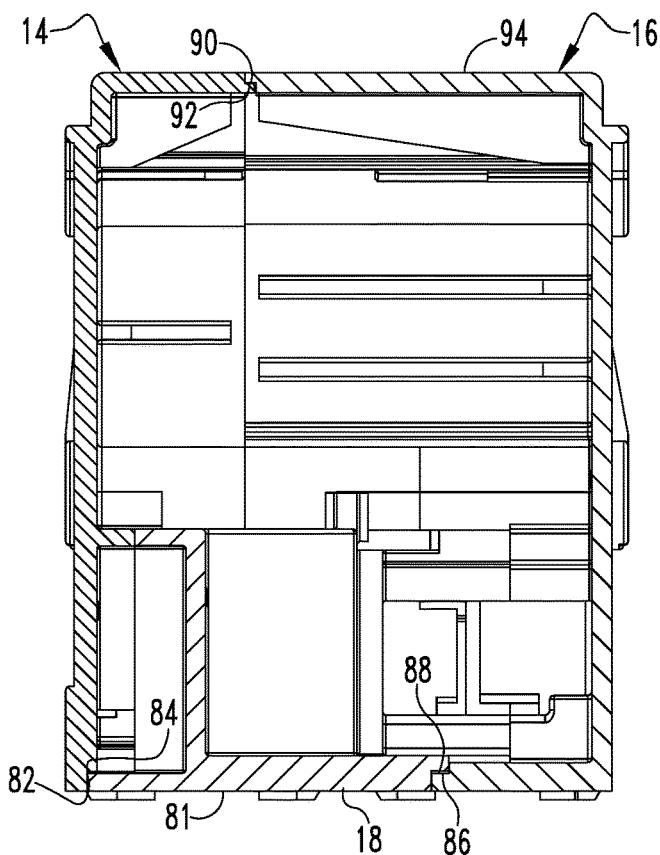
FIG. 13 is a sectional view as taken along line 11-11 of FIG. 1.
Figure 14:
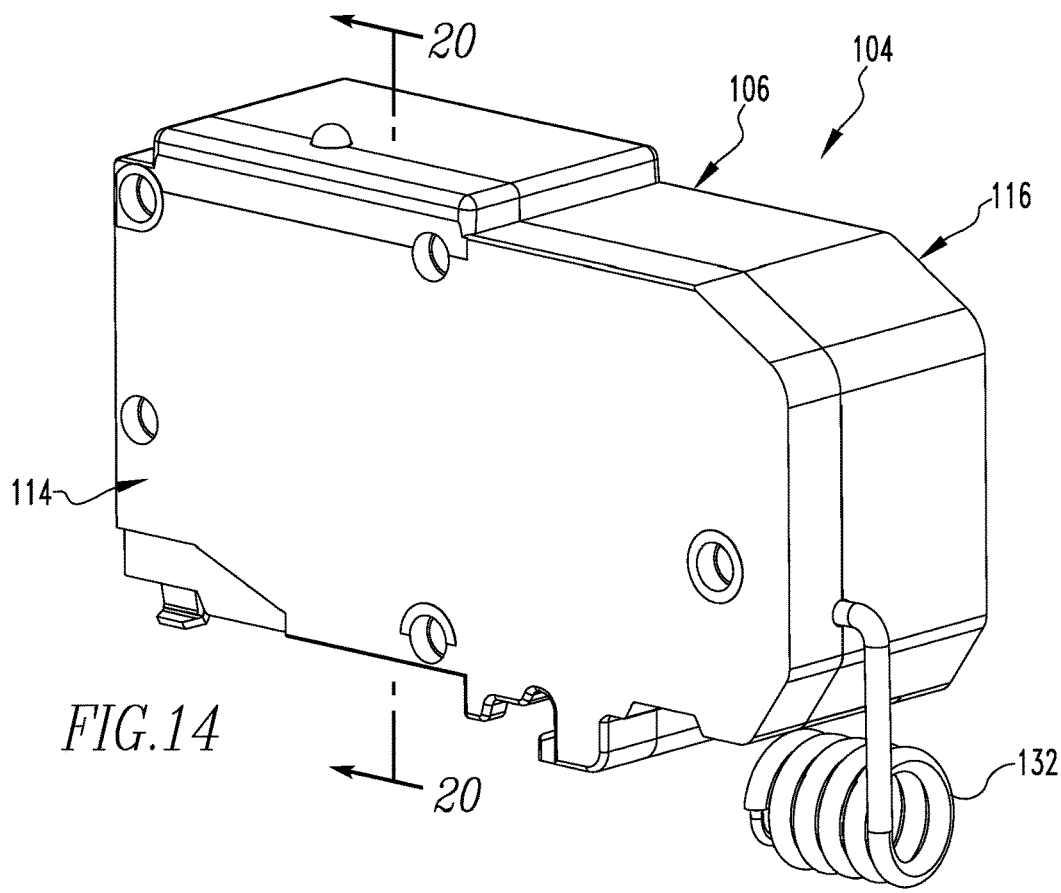
FIG. 14 is a perspective view of surge protection device in accordance with a second embodiment of the disclosed and claimed concept.
Figure 15:
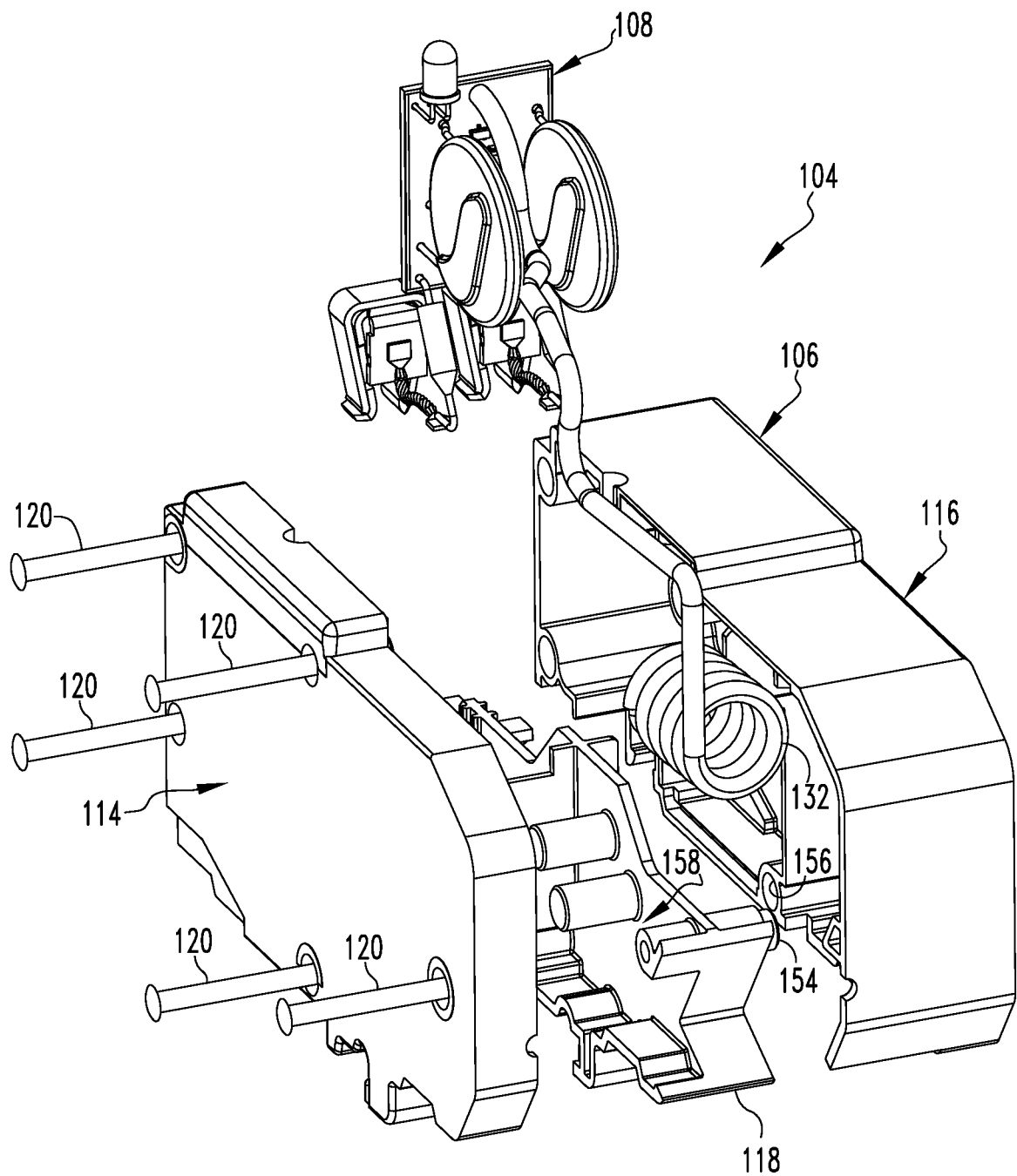
FIG. 15 is an exploded view of the second embodiment.
Figure 16:
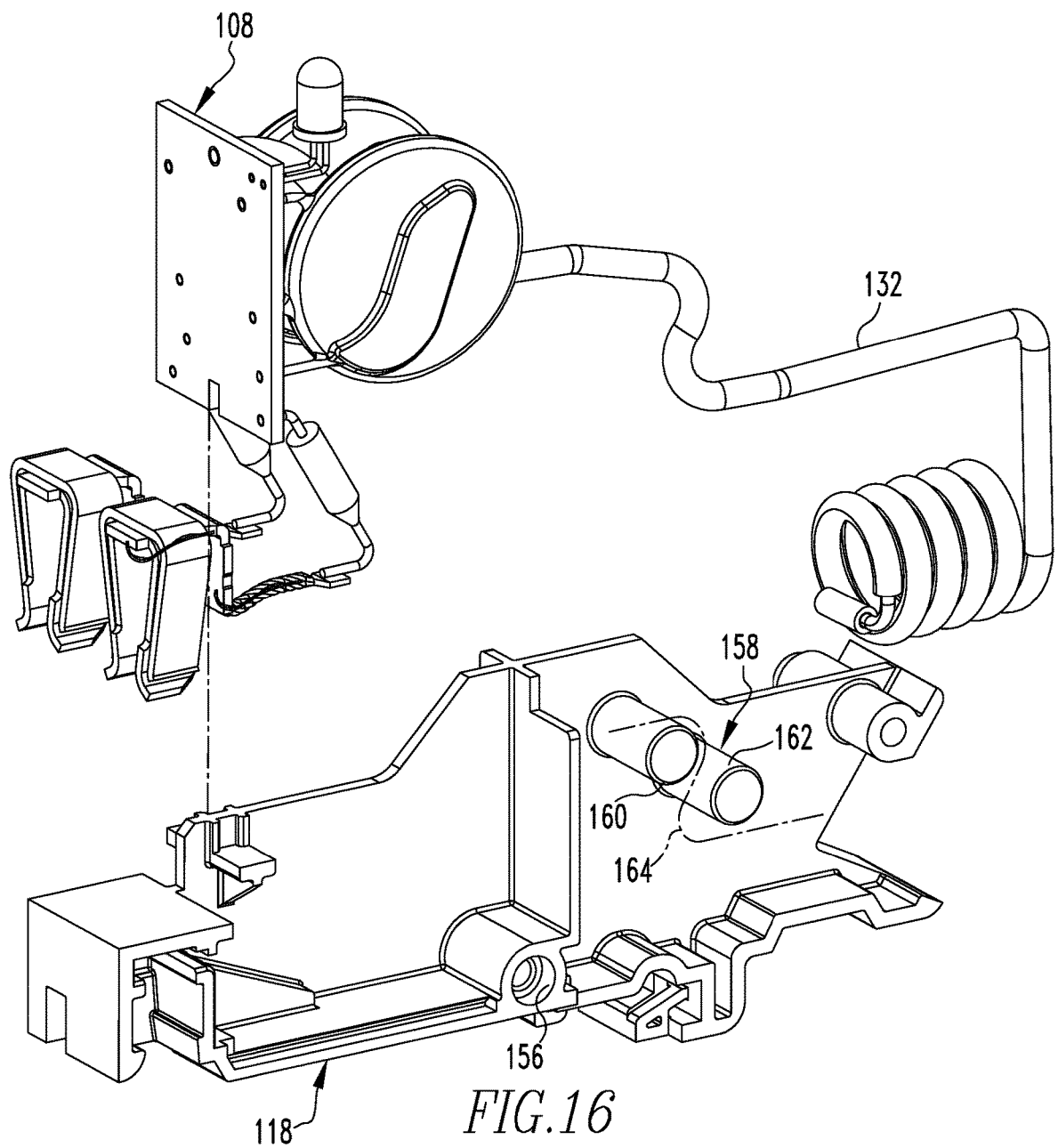
FIG. 16 is a perspective view of an electronic apparatus and a middle portion of a housing of the second embodiment exploded away from one another.
Figure 17:
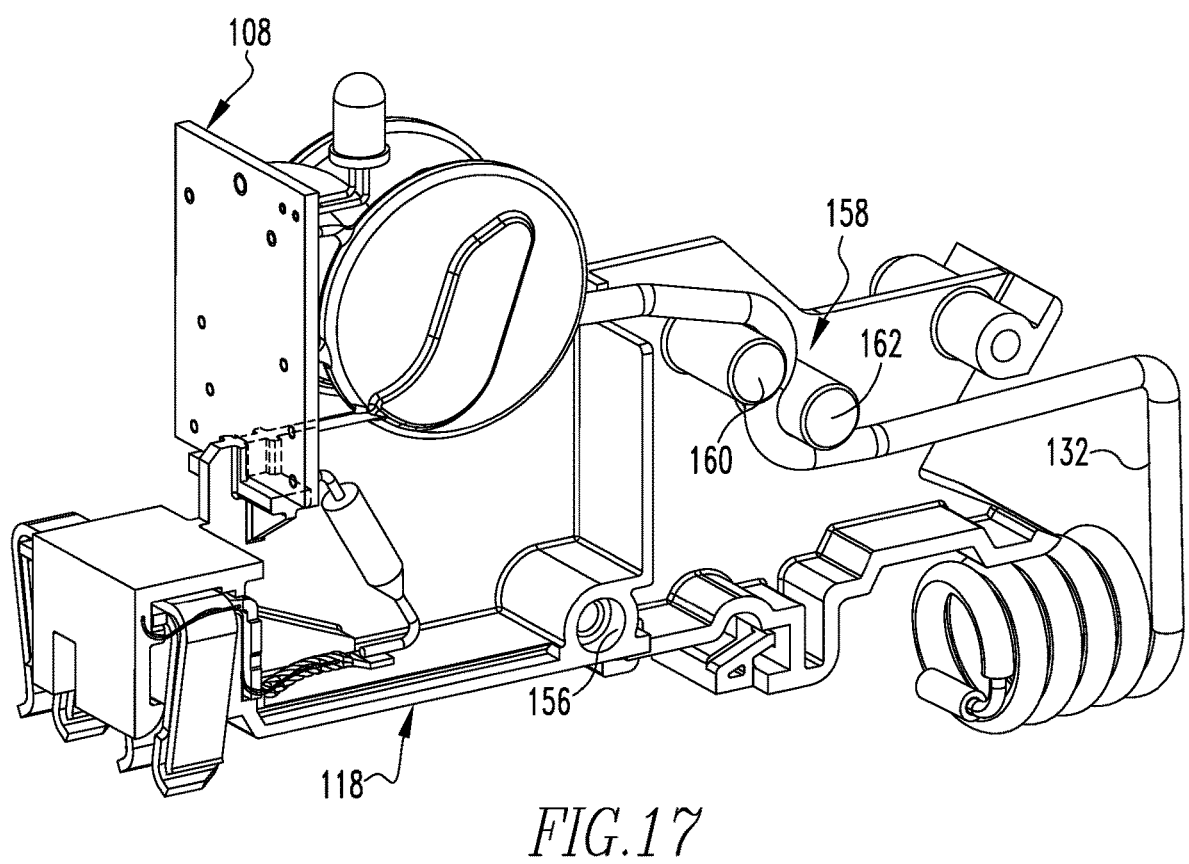
FIG. 17 is a view similar to FIG. 16, except depicting the electronic apparatus and the middle portion in a non-exploded condition.
Figure 18:
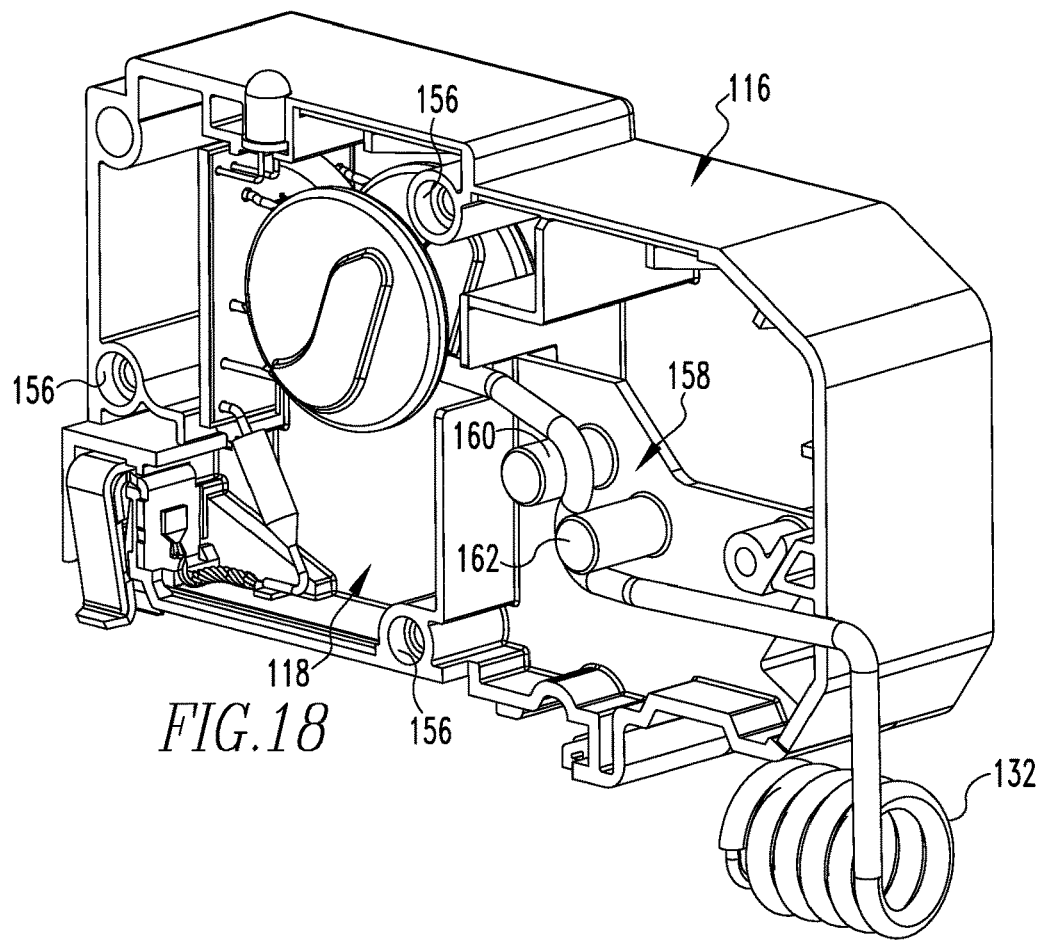
FIG. 18 is a view similar to FIG. 17, but showing an additional portion of the housing.
Figure 19:
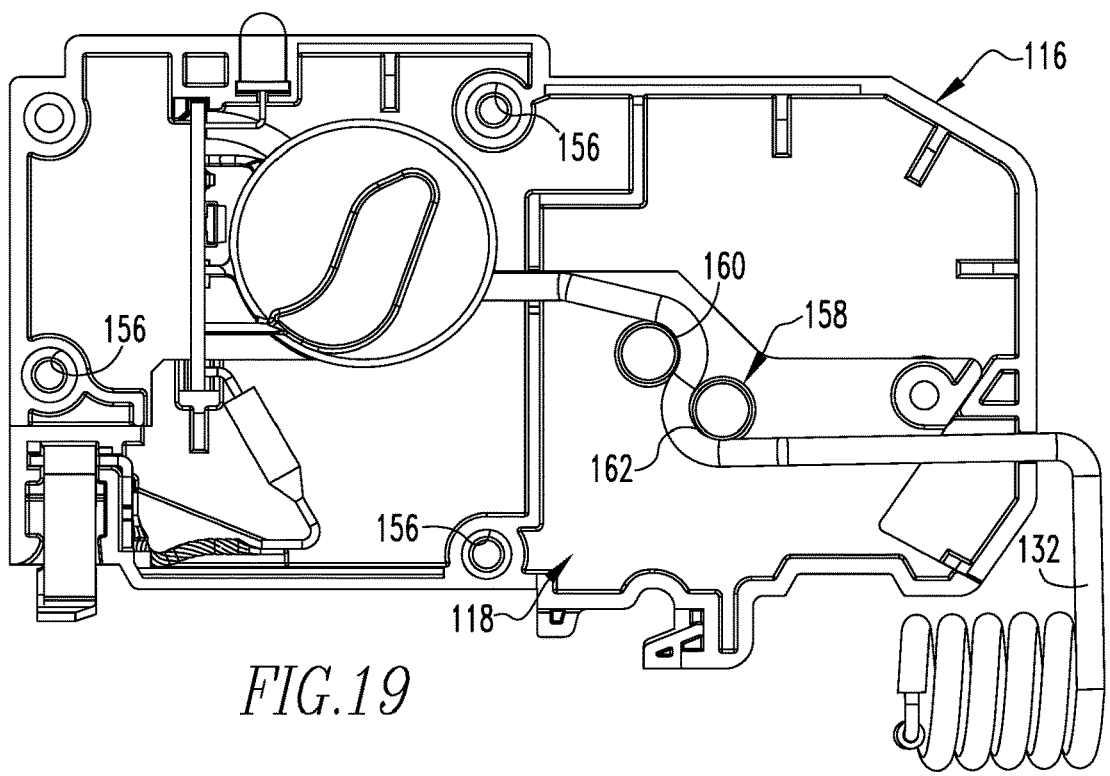
FIG. 19 is a view similar to FIG. 18, except depicting the subject matter of FIG. 18 in a front elevational view.
Figure 20:
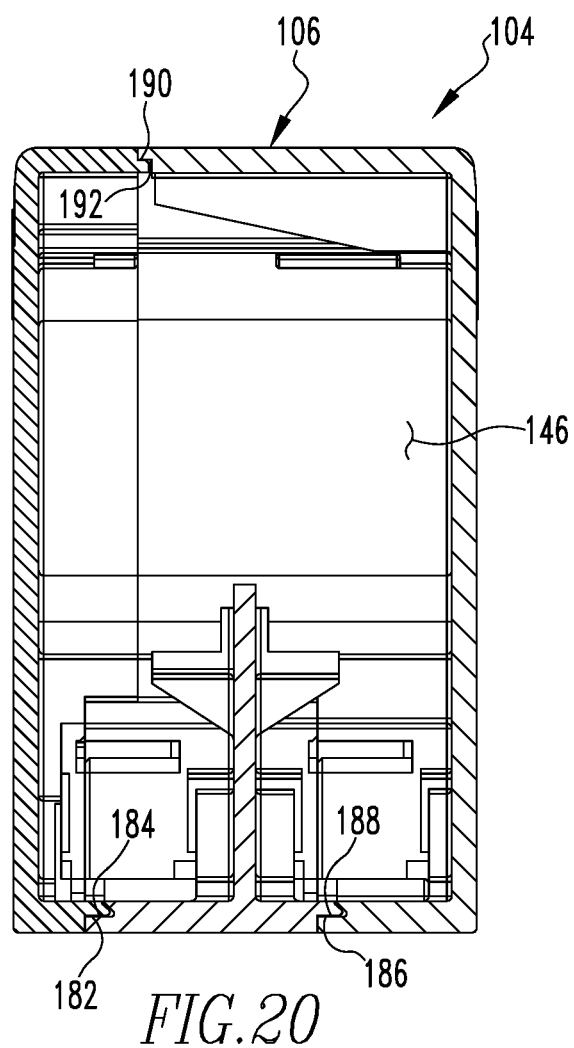
FIG. 20 is a sectional view as taken along line 20-20 of FIG. 14.

As can be understood from FIG. 13, the housing 6 includes a set of overlapping surfaces in the form of ledges that are formed on the housing 6 and that resists gases and the like that might be generated by the varistors 38 in a surge situation from exiting out of the housing 6 and potentially damaging the load center or other structure on which the surge protection device 4 is mounted. As can be understood from FIG. 13 and from certain of the other drawings presented herein, the first lateral portion 14 includes a first ledge 82 formed thereon adjacent a surface 81 of the housing 6. The middle portion 18 includes a second ledge 84, and it can be seen that the first and second ledges 82 and 84 overlie one another to present a tortuous gas path that resists the passage of gases that might be generated by the varistors 38 from passing out of the interior region 46 between the middle portion 18 and the first lateral portion 14 and out of the surface 81. It can further be seen from FIG. 13 that the middle portion 18 additionally includes a third ledge 86 and that the second lateral portion 18 includes a fourth ledge 88, with the third and fourth ledges 86 and 88 overlapping one another to present another tortuous path that resists the passage of gases from the interior region 46 between the middle portion 18 and the second lateral portion 16 and out of the surface 81. The overlapping first and second ledges 82 and 84 and the overlapping third and fourth ledges 86 and 88 thus resist the passage of gases out of the surface 81, which is advantageous. It can further be seen from FIG. 13 that the first lateral portion 14 includes a fifth ledge 90 and that the second lateral portion 16 includes a sixth ledge 92 that overlap one another and that resists the passage of gases from the interior region 46 between the first and second lateral portions 14 and 16 and out of another surface 94 of the housing 6 that is opposite the surface 81 by providing another tortuous path at the surface 94 between the interior region 46 and the exterior 48. These various tortuous paths advantageously resist the passage of gases from the interior region 46 to the exterior 48 and thus advantageously avoids damage to the load center or other structure to which the surge protection device 4 is mounted.

It thus can be seen that the surge protection device 4 is configured such that its housing 6 enables rapid assembly and self-alignment using the alignment bosses 54 and the alignment receptacles 56. The strain relief 58 advantageously protects the integrity of the electronic apparatus 8 by resisting damage to the electrical connection between the neutral wire 32 and the circuit board 24 by frictionally engaging the strain relief 58. The various overlapping ledges 82, 84, 86, 88, 90, and 92 advantageously resist the escape of gases from the varistors 38 from the interior region 46 to the exterior 48, which advantageously protects a load center or other electrical structure from damage due to the protective operation of the varistors 38 in the event of a surge.

An improved surge protection device 104 in accordance with a second embodiment of the disclosed and claimed concept is depicted generally in FIGS. 14-20. The surge protection device 104 is similar to the surge protection device 4 and includes a housing 106 and an electronic apparatus 108. The housing 106 includes a first lateral portion 114, a second lateral portion 116, and a middle portion 118 that are connected together with a plurality of fasteners 120 and employing cooperating alignment bosses and alignment receptacles through which the fasteners 120 are received in a fashion similar to the way in which the first and second lateral portions 14 and 16 and the middle portion 18 are connected together and are arranged together through the use of the fasteners 20. The electronic apparatus 108 likewise includes a neutral wire 132.

However, and as can be understood from FIGS. 16-19, the housing 106 includes a strain relief 158 that has a slightly different configuration than the strain relief 58 of the housing 6. More specifically, the strain relief 158 includes a first wall portion 160 and a second wall portion 162 that are in the form of discrete posts that are spaced apart from one another but that are situated adjacent a routing path 164 having a plurality of turns in opposite directions that provide a tortuous path through which the neutral wire 132 extends. As with the strain relief 58, the strain relief 158 is configured such that the neutral wire 132, when pulled, frictionally engages the first and second wall portions 160 and 162 with sufficient frictional force to withstand a predetermined force for a predetermined period of time which, according to the aforementioned UL standard, is a loading of 35 pounds force applied for one minute to the neutral wire 132.

Similar to the housing 6, the housing 106 is configured such that the first lateral portion 104 includes a first ledge 182 and the fifth ledge 190, the middle portion 118 includes a second ledge 184 and a third ledge 186, and the second lateral portion 116 includes a fourth ledge 188 and a sixth ledge 192. The first and second ledges 182 and 184 overlap one another, the third and fourth ledges 186 and 188 overlap one another, and the fifth and sixth ledges 190 and 192 overlap one another to provide tortuous paths that resist the passage of gases from and interior region 146 of the surge protection device 104 to the exterior thereof, which advantageously resists damage to a load center or other structure to which the surge protection device 104 has been mounted.

As can be understood from FIGS. 15-19, the housing 106 likewise includes a number of alignment bosses 154 that are cooperable with a number of alignment receptacles 156 in order to align the first and second lateral portions 114 and 116 and the middle portion 118 with one another in order to facilitate reception of the fasteners 120 therein and to facilitate assembly for manufacture of the surge protection device 104 with relative ease. Other advantages will be apparent.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A surge protection device comprising:
a housing comprising a first lateral portion, a second lateral portion, and a middle portion, at least a part of the middle portion being situated between the first and second lateral portions, the housing having an interior region;
an electronic apparatus situated on the housing, the electronic apparatus comprising a circuit board, at least a first varistor electrically connected with the circuit board, and at least a first line terminal electrically connected with the circuit board, the circuit board and the at least first varistor being situated within the interior region; and
at least one of the circuit board and the middle portion having a receptacle formed therein, at least a portion of the other of the at least one of the circuit board and the middle portion being received in the receptacle to thereby mount the circuit board to the middle portion,
wherein the housing further comprises a number of alignment bosses and a number of alignment receptacles, an alignment boss of the number of alignment bosses being situated on one of the first lateral portion, the second lateral portion, and the middle portion and being received in an alignment receptacle of the number of alignment receptacles that is formed on another of the first lateral portion, the second lateral portion, and the middle portion.

2. A surge protection device comprising:
a housing comprising a first lateral portion, a second lateral portion, and a middle portion, at least a part of the middle portion being situated between the first and second lateral portions, the housing having an interior region;
an electronic apparatus situated on the housing, the electronic apparatus comprising a circuit board, at least a first varistor electrically connected with the circuit board, and at least a first line terminal electrically connected with the circuit board, the circuit board and the at least first varistor being situated within the interior region; and
at least one of the circuit board and the middle portion having a receptacle formed therein, at least a portion of the other of the at least one of the circuit board and the middle portion being received in the receptacle to thereby mount the circuit board to the middle portion,
wherein the housing further comprises a number of fasteners, a fastener of the number of fasteners directly affixing together the first lateral portion and the middle portion, and the fastener further directly affixing together the second lateral portion and the middle portion, another fastener of the number of fasteners directly affixing together the first lateral portion and the second lateral portion.

3. The surge protection device of claim 1 wherein the housing further comprises a number of fasteners, a fastener of the number of fasteners being received through the alignment boss and the alignment receptacle.

4. The surge protection device of claim 1 wherein at least one of the first lateral portion and the middle portion includes a ledge that overlaps the other of the first lateral portion and the middle portion, and wherein at least one of the second lateral portion and the middle portion includes another ledge that overlaps the other of the second lateral portion and the middle portion.

5. The surge protection device of claim 1 wherein:
the electronic apparatus further comprises a neutral wire electrically connected with the circuit board and having a free end situated at an exterior of the housing;
the housing further comprising a strain relief that comprises a first wall portion, a second wall portion, and a routing path through which at least a portion of the neutral wire is routed between the interior region and the exterior, the first and second wall portions each being situated adjacent the routing path, the neutral wire extending adjacent the first and second wall portions and being structured to frictionally engage the first and second wall portions with sufficient friction to resist a predetermined tension applied to a portion of the neutral wire situated at the exterior.

6. The surge protection device of claim 1 wherein:
the electronic apparatus further comprises a neutral wire electrically connected with the circuit board and having a free end situated at an exterior of the housing;
the housing further comprising a strain relief that comprises a routing path through which at least a portion of the neutral wire is routed between the interior region and the exterior, the neutral wire being structured to frictionally engage the housing with sufficient friction to resist a predetermined tension applied to the free end.

7. The surge protection device of claim 1 wherein:
the receptacle is formed in the circuit board;
the at least portion of the other of the at least one of the circuit board and the middle portion being a tab situated on the middle portion and being received in the receptacle;
the circuit board further comprising a first surface and a second surface opposite one another; and
the middle portion further comprising a first abutment situated adjacent the first surface and a second abutment situated adjacent the second surface.

8. The surge protection device of claim 7 wherein:
the tab is situated between the first and second abutments;
the receptacle extending between the first and second surfaces;
the first abutment engaging the first surface adjacent the receptacle; and
the second abutment engaging the second surface adjacent the receptacle.

9. The surge protection device of claim 1 wherein:
the receptacle is formed in an end of the circuit board;
the at least portion of the other of the at least one of the circuit board and the middle portion being a tab situated on the middle portion and being received in the receptacle;
the first lateral portion comprising a first support that engages another end of the circuit board opposite the end;
the second lateral portion comprising a second support that engages the another end of the circuit board.

10. A surge protection device comprising:
a housing comprising a first lateral portion, a second lateral portion, and a middle portion, at least a part of the middle portion being situated between the first and second lateral portions, the housing having an interior region;

an electronic apparatus situated on the housing, the electronic apparatus comprising a circuit board, a neutral wire, and at least a first line terminal electrically connected with the circuit board, the circuit board being situated within the interior region, the neutral wire being electrically connected with the circuit board and having a free end situated at an exterior of the housing; and the housing further comprising a strain relief that comprises a routing path through which at least a portion of the neutral wire is routed between the interior region and the exterior, the neutral wire being structured to frictionally engage the housing with sufficient friction to resist a predetermined tension applied to a portion of the neutral wire situated at the exterior.

11. The surge protection device of claim 10 wherein the strain relief comprises a first wall portion and a second wall portion, the first and second wall portions each being situated adjacent the routing path, the neutral wire extending adjacent the first and second wall portions and being structured to frictionally engage the first and second wall portions with sufficient friction to resist the predetermined tension.

12. The surge protection device of claim 10 wherein the housing further comprises a number of fasteners, a fastener of the number of fasteners directly affixing together the first lateral portion and the middle portion, and the fastener further directly affixing together the second lateral portion and the middle portion, another fastener of the number of fasteners directly affixing together the first lateral portion and the second lateral portion.

13. The surge protection device of claim 10 wherein the housing further comprises a number of alignment bosses and a number of alignment receptacles, an alignment boss of the number of alignment bosses being situated on one of the first lateral portion, the second lateral portion, and the middle portion and being received in an alignment receptacle of the number of alignment receptacles that is formed on another of the first lateral portion, the second lateral portion, and the middle portion.

14. The surge protection device of claim 13 wherein the housing further comprises a number of fasteners, a fastener of the number of fasteners being received through the alignment boss and the alignment receptacle.

15. The surge protection device of claim 10 wherein at least one of the first lateral portion and the middle portion includes a ledge that overlaps the other of the first lateral portion and the middle portion, and wherein at least one of the second lateral portion and the middle portion includes another ledge that overlaps the other of the second lateral portion and the middle portion.

16. The surge protection device of claim 10 wherein at least one of the circuit board and the middle portion has a receptacle formed therein, at least a portion of the other of the at least one of the circuit board and the middle portion being received in the receptacle to thereby mount the circuit board to the middle portion.

17. The surge protection device of claim 16 wherein:
the receptacle is formed in the circuit board;
the at least portion of the other of the at least one of the circuit board and the middle portion being a tab situated on the middle portion and being received in the receptacle;
the circuit board further comprising a first surface and a second surface opposite one another; and
the middle portion further comprising a first abutment situated adjacent the first surface and a second abutment situated adjacent the second surface.

18. The surge protection device of claim 17 wherein:
the tab is situated between the first and second abutments;
the receptacle extending between the first and second surfaces;
the first abutment engaging the first surface adjacent the receptacle; and
the second abutment engaging the second surface adjacent the receptacle.

19. The surge protection device of claim 10 wherein:
the receptacle is formed in an end of the circuit board;
the at least portion of the other of the at least one of the circuit board and the middle portion being a tab situated on the middle portion and being received in the receptacle;
the first lateral portion comprising a first support that engages another end of the circuit board opposite the end;
the second lateral portion comprising a second support that engages the another end of the circuit board.

* * * * *